United States Patent
Suzuki et al.

(10) Patent No.: US 9,947,599 B2
(45) Date of Patent: Apr. 17, 2018

(54) METHOD FOR PECVD OVERLAY IMPROVEMENT

(71) Applicant: Applied Materials, Inc., Santa Clara, CA (US)

(72) Inventors: Yoichi Suzuki, Funabashi (JP); Michael Wenyoung Tsiang, Fremont, CA (US); Kwangduk Douglas Lee, Redwood City, CA (US); Takashi Morii, Wakayama (JP); Yuta Goto, Saiki (JP)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/492,428

(22) Filed: Apr. 20, 2017

(65) Prior Publication Data

US 2017/0309525 A1    Oct. 26, 2017

Related U.S. Application Data

(60) Provisional application No. 62/326,538, filed on Apr. 22, 2016.

(51) Int. Cl.

| | |
|---|---|
| *H01L 21/66* | (2006.01) |
| *C23C 16/50* | (2006.01) |
| *C23C 16/52* | (2006.01) |
| *C23C 16/56* | (2006.01) |
| *H01L 21/324* | (2006.01) |
| *H01L 21/02* | (2006.01) |
| *H01L 21/67* | (2006.01) |
| *H01L 21/677* | (2006.01) |

(52) U.S. Cl.
CPC ............. *H01L 22/20* (2013.01); *C23C 16/50* (2013.01); *C23C 16/52* (2013.01); *C23C 16/56* (2013.01); *H01L 21/02274* (2013.01); *H01L 21/324* (2013.01); *H01L 21/67098* (2013.01); *H01L 21/67167* (2013.01); *H01L 21/67196* (2013.01);
(Continued)

(58) Field of Classification Search
CPC ... H01L 22/20; H01L 22/12; H01L 21/67167; H01L 21/67098; H01L 21/67196; H01L 21/67201; H01L 21/67207; H01L 21/67742; H01L 21/67288; H01L 21/324;
(Continued)

(56) References Cited

U.S. PATENT DOCUMENTS

| | | | |
|---|---|---|---|
| 4,385,434 A | 5/1983 | Zehnpfennig et al. | |
| 4,760,265 A | 7/1988 | Yoshida et al. | |

(Continued)

OTHER PUBLICATIONS

PCT International Search Report and Written Opinion dated Jul. 3, 2017, for International Application No. PCT/US2017/024323.

*Primary Examiner* — Michael Trinh
(74) *Attorney, Agent, or Firm* — Patterson + Sheridan LLP

(57) ABSTRACT

The present disclosure generally relates to a method for performing semiconductor device fabrication, and more particularly, to improvements in lithographic overlay techniques. The method for improved overlay includes depositing a material on a substrate, heating a substrate in a chamber using thermal energy, measuring a local stress pattern of each substrate, wherein measuring the local stress pattern measures an amount of change in a depth of the deposited material on the substrate, plotting a plurality of points on a k map to determine a local stress pattern of the substrate, adjusting the thermal energy applied to the points on the k map, determining a sensitivity value for each of the points on the k map, and applying a correction factor to the applied thermal energy to adjust the local stress pattern.

20 Claims, 5 Drawing Sheets

(52) U.S. Cl.
CPC .. *H01L 21/67201* (2013.01); *H01L 21/67207* (2013.01); *H01L 21/67288* (2013.01); *H01L 21/67742* (2013.01); *H01L 22/12* (2013.01)

(58) Field of Classification Search
CPC ............. G03F 7/70633; G03F 7/70525; G03F 7/70783
See application file for complete search history.

(56) References Cited

U.S. PATENT DOCUMENTS

| | | | |
|---|---|---|---|
| 6,404,481 | B1 | 6/2002 | Feldman et al. |
| 6,847,433 | B2 | 1/2005 | White et al. |
| 8,111,376 | B2 | 2/2012 | Adel et al. |
| 2005/0036135 | A1 | 2/2005 | Earthman et al. |
| 2008/0030701 | A1* | 2/2008 | Lof ................... G03F 7/70425 355/53 |
| 2012/0244461 | A1 | 9/2012 | Nagai |
| 2015/0287569 | A1 | 10/2015 | Yamamoto et al. |
| 2015/0363536 | A1* | 12/2015 | Chidambarrao .... H01L 27/0207 716/53 |
| 2015/0371908 | A1* | 12/2015 | Bencher ................. H01L 22/20 438/4 |
| 2016/0099147 | A1* | 4/2016 | Kulshreshtha .......... C23C 16/26 438/16 |
| 2016/0203971 | A1* | 7/2016 | Tsiang ................ H01L 21/0217 257/640 |

\* cited by examiner

METHOD FOR PECVD OVERLAY IMPROVEMENT

CROSS-REFERENCE TO RELATED APPLICATIONS

This application claims benefit of U.S. provisional patent application Ser. No. 62/326,538, filed Apr. 22, 2016, which is herein incorporated by reference.

BACKGROUND OF THE DISCLOSURE

Field of the Disclosure

Embodiments of the present disclosure generally relate to semiconductor processing. More specifically, embodiments of the disclosure relate to a method for plasma-enhanced chemical vapor deposition (PECVD) lithography overlay.

Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Typically, devices on semiconductor substrates are manufactured by a sequence of lithographic processing steps in which the devices are formed from a plurality of overlying layers, each having an individual pattern. Generally, a set of 15 to 100 masks is used to construct a chip and can be used repeatedly.

Between one layer and the next layer that overlays the one layer, the individual patterns of the one layer and the next layer must be aligned. However, due to pattern and material differences in the multiple overlying layers, film stress and/or topography variations (or pattern related differences) between layers are inevitable. The generated film stress between the layers formed on the substrate will cause the substrate to deform, which can lead to device yield issues for the semiconductor devices formed on the substrate. The residual stress may be created during substrate processing steps due to differences in thermal expansion, plasma non-uniformity distribution and/or plasma density during a plasma etching or plasma deposition processes, which results in the localized deformation of the substrate surface and leads to undesirable overlay error. When overlay errors, or pattern displacement undesirably occurs, the size, dimension or structures of device dies formed on the substrate may be irregularly deformed or distorted, thus increasing likelihood of misalignment between the film layers stacked thereon that may adversely increase the probability of misalignment in the subsequent lithographic exposure process.

Therefore, since the localized curvature formed in a substrate can have a dramatic effect on the ability to reliably form the next generation of semiconductor devices, which have smaller device feature sizes, there is a need for a system and method for detecting the localized deformation of a semiconductor substrate which can be used to adjust or correct the localized deformation in the substrate.

SUMMARY OF THE DISCLOSURE

Embodiments of the disclosure provide methods and system for improved overlay. In one embodiment, a method for improved overlay between more than one chamber. The method includes heating a substrate in each chamber using thermal energy, measuring a local stress pattern of each substrate, adjusting the thermal energy applied provided to each chamber, determining a sensitivity value in response to adjusting the thermal energy in each chamber, and applying a correction factor to the applied thermal energy to adjust the local stress pattern between each chamber.

In another embodiment, a method for improved overlay in a processing system is disclosed. The method includes heating a substrate in each chamber using thermal energy, measuring a local stress pattern using a metrology tool for each substrate, determining a thermal adjustment recipe in a computing system based on the substrate stress pattern obtained from the measurement process in the processing system in each chamber, and applying a correction factor to the thermal energy disposed in the processing system to adjust the local stress pattern between each chamber.

In another embodiment, a non-transitory computer-readable medium is disclosed. The non-transitory computer-readable medium includes instructions, that, when executed by a processing unit of a system, cause the system to monitoring a stress pattern in the system by performing the steps of: heating a substrate in each chamber using thermal energy, measuring a local stress pattern using a metrology tool for each substrate, determining a thermal adjustment recipe in a computing system based on the substrate stress pattern obtained from the measurement process in the processing system in each chamber and applying a correction factor to the thermal energy disposed in the processing system to adjust the local stress pattern between each chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present disclosure generally relates to a method for performing semiconductor device fabrication, and more particularly, to improvements in lithographic overlay techniques. The method for improved overlay includes heating a substrate in a chamber using thermal energy, plotting one or more points on a k map to determine a local stress pattern of the substrate, adjusting the thermal energy applied to the one or more points on the k map, determining a sensitivity value for each of the one or more points on the k map, and applying a correction factor to the applied thermal energy to adjust the local stress pattern.

Figure 1:
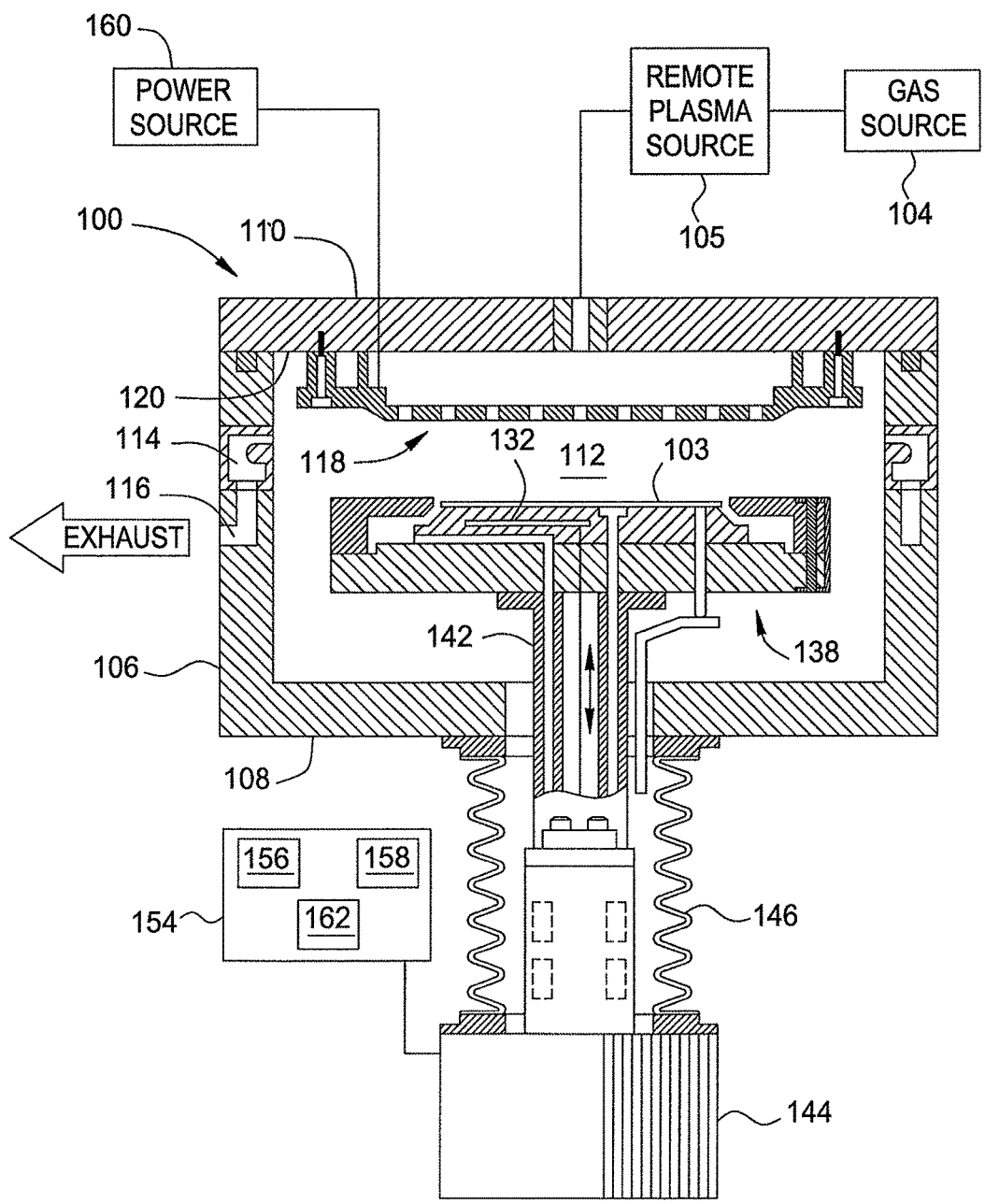
FIG. 1 shows a partial cross sectional view of an exemplary plasma processing chamber 100 which may be used or modified to perform the methods described herein.

FIG. 1 shows a partial cross sectional view of an exemplary plasma processing chamber 100 which may be used or modified to perform the methods described herein. Embodiments described herein may be performed using any suitable processing chamber such as a plasma enhanced chemical vapor deposition (PECVD) chamber. The processing chamber may be incorporated into a substrate processing system. Examples of suitable systems include the CENTURA® systems which may use a DxZ™ processing chamber, PRECISION 5000® systems, PRODUCER™ systems, PRODUCER GT™ and the PRODUCER SE™ processing chambers which are commercially available from Applied Materials, Inc., located in Santa Clara, Calif. It is contemplated that other deposition processing system, including those available from other manufacturers, may be adapted to practice the embodiments described herein.

The process chamber 100 may be part of a processing system that includes multiple process chambers connected to a central transfer chamber and serviced by a robot. The process chamber 100 includes walls 106, a bottom 108, and a lid 110 that define a process volume 112. The walls 106 and bottom 108 can be fabricated from a unitary block of aluminum. The process chamber 100 may also include a pumping ring 114 that fluidly couples the process volume 112 to an exhaust port 116 as well as other pumping components (not shown).

A substrate support assembly 138, which may be heated, may be centrally disposed within the process chamber 100. In one embodiment, the substrate support assembly 138 may be heated with thermal energy from one or more heaters disposed within the assembly. The substrate support assembly 138 supports a substrate 103 during a deposition process. The substrate support assembly 138 generally is fabricated from aluminum, ceramic or a combination of aluminum and ceramic, and includes at least one bias electrode 132. The bias electrode 132 may be an e-chuck electrode, an RF substrate bias electrode, or combinations thereof.

Generally, the substrate support assembly 138 is coupled to a stem 142. The stem 142 provides a conduit for electrical leads, vacuum and gas supply lines between the substrate support assembly 138 and other components of the process chamber 100. Additionally, the stem 142 couples the substrate support assembly 138 to a lift system 144 that moves the substrate support assembly 138 between an elevated position (as shown in FIG. 1) and a lowered position (not shown) to facilitate robotic transfer. Bellows 146 provides a vacuum seal between the process volume 112 and the atmosphere outside the chamber 100 while facilitating the movement of the substrate support assembly 138.

The showerhead 118 may generally be coupled to an interior side 120 of the lid 110. Gases (i.e., process gases and/or other gases) that enter the process chamber 100 pass through the showerhead 118 and into the process chamber 100. A remote plasma source 105 may be coupled between a gas source 104 and the process volume 112. A plasma power source 160 may be coupled to the showerhead 118 to energize the gases through the showerhead 118 towards substrate 103 disposed on the substrate support assembly 138. The plasma power source 160 may provide power for the formation of a plasma region, such as RF power or microwave power.

The function of the process chamber 100 can be controlled by a computing device 154. The computing device 154 may be a controller. The computing device 154 may be one of any form of general purpose computer that can be used in an industrial setting for controlling various chambers and sub-processors. The computing device 154 includes a computer processor 156, memory 158, and various support circuits 162, which may be coupled to the computer processor 156 for supporting the computer processor 156 in a conventional manner. Software routines, as required, may be stored in the memory 158 or executed by a second computing device (not shown) that is remotely located. The computing device 154 may further include one or more computer readable media (not shown).

Figure 2A:
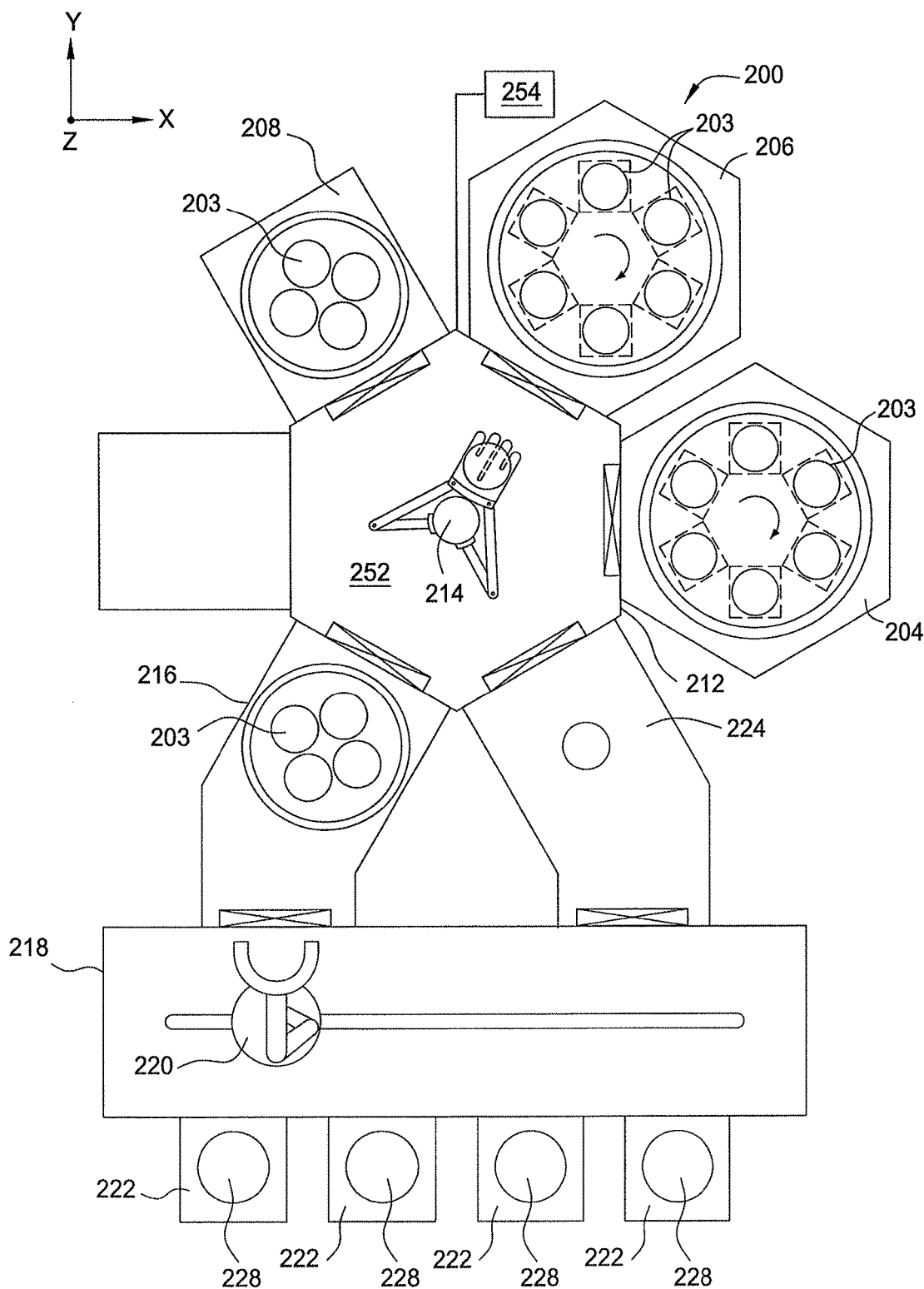
FIG. 2A shows a plan view of a processing system, according to one embodiment.

FIG. 2A shows a plan view of a processing system 200 that incorporates one or more chambers, such as chamber 100 depicted in FIG. 1, so as to perform an improved overlay process in a single process system. The processing system 200 generally creates a processing environment where various processes can be performed on a substrate, such as a stress and/or overlay measurement process and the surface modification process. The processing system 200 generally include the system controller 254 programmed to carry out various processes performed in the processing system 200.

The system controller 254 may be used to control one or more components found in the processing system 200. In some configurations, the system controller 254 may form part of the controller 154, which is discussed above with reference to FIG. 1. The system controller 254 is generally designed to facilitate the control and automation of the processing system 200 and typically includes a central processing unit (CPU) (not shown), memory (not shown), and support circuits (or I/O) (not shown).

The processing system 200 includes a plurality of processing chambers 204, 206, 208, and a transfer chamber 212. Each processing chamber 204, 206, 208 may be configured to process one or more substrates 203 at a time. The processing chamber 204, 206, 208 may have the same or different substrate processing capacities.

The processing system 200 may also include load lock chambers 216 and 224 that are connected to the transfer chamber 212. In one embodiment, the load lock chambers 216 and 224 may also be used as one or more service chambers for providing various functions for processing within the processing system 200, for example, substrate orientation, substrate inspection, heating, cooling, degassing, or the like.

The transfer chamber 212 defines a transfer volume 252. A substrate transfer robot 214 is disposed in the transfer volume 252 for transferring substrates 203 among the processing chamber 204, 206, 208, and the load lock chambers 216 or 224.

The processing system 200 may include a factory interface 218 connecting one or more pod loaders 222 and the load lock chambers 216 and 224. The load lock chambers 216 and 224 provides a first vacuum interface between the factory interface 218 and the transfer chamber 212, which may be maintained in a vacuum state during processing. Each pod loader 222 is configured to accommodate a cassette 228 for holding and transferring a plurality of substrates. The factory interface 218 includes a FI robot 220 configured to shuttle substrates between the load lock chambers 216 and 224, and the one or more pod loaders 222. The processing system 200 may perform the method described below for an improved overlay process in a single process system.

Figure 2B:
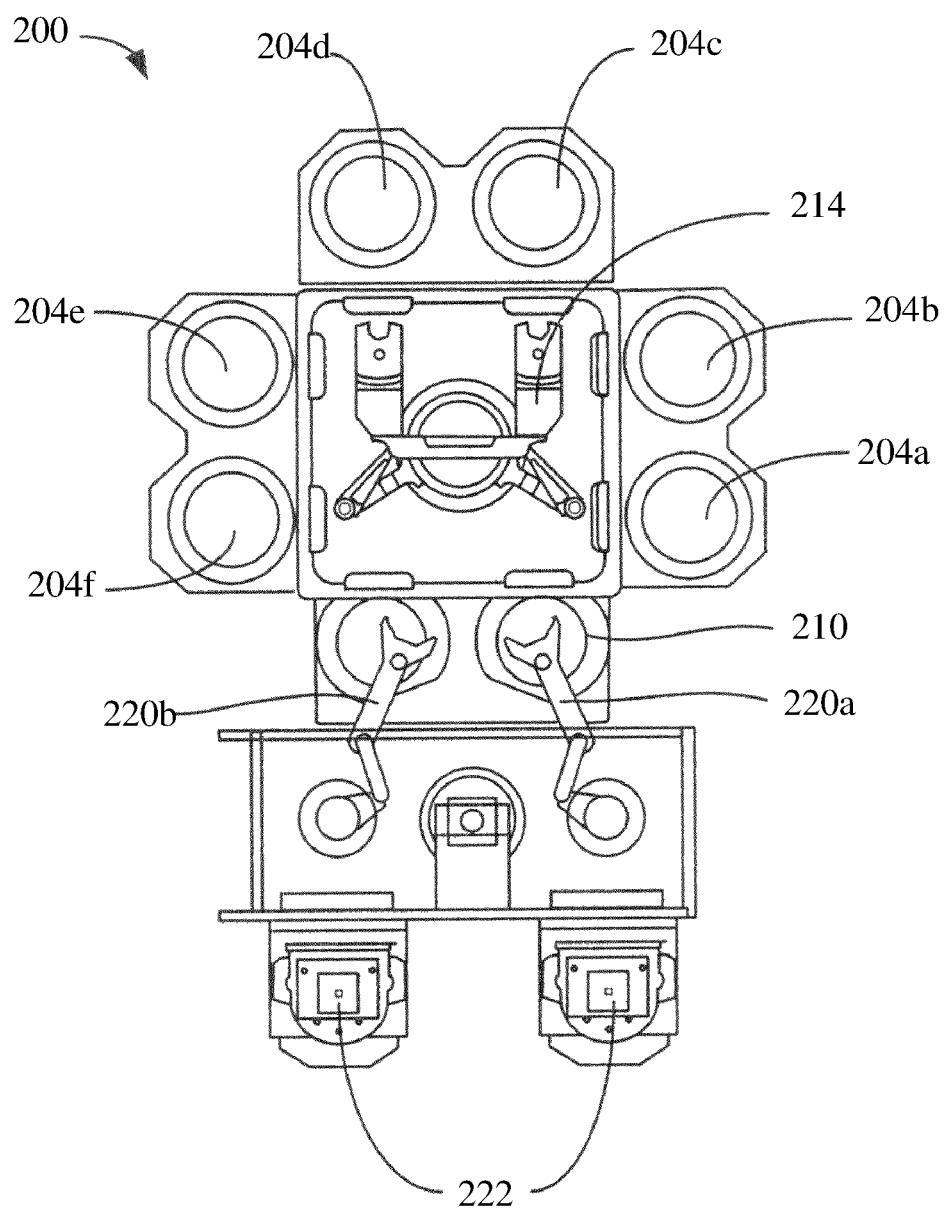
FIG. 2B shows a plan view of a processing system, according to another embodiment.

FIG. 2B shows a plan view of another processing system 200 that incorporates one or more chambers, such as chamber 100 depicted in FIG. 1, so as to perform an improved overlay process in a single process system. The processing system 200 generally creates a processing environment where various processes can be performed on a substrate, such as a stress and/or overlay measurement process and the surface modification process. The processing system 200 generally include pod loader 222, robot 220, holding area 210, transfer robot 214, and processing chambers 204a-204f.

The pod loader 222 includes a pair of FOUPs (front opening unified pods). Substrates 203 are transferred from the pod loader 222 into a low pressure holding area 210 by robot 220. The robot 220 may include two robotic arms 220a, 220b. Each robotic arm 220a, 220b transfers different substrates 203 from each of the pod loaders 222. A transfer robot 214 is used to transfer the substrates 203 from the holding area 210 to the processing chambers 204a-204f and back. The processing chambers 204a-204f may include one or more system components for depositing, annealing, curing, and/or etching a substrate 203. The processing system 200 of FIG. 2B may perform the method described below for an improved overlay process in a single process system.

Figure 3:
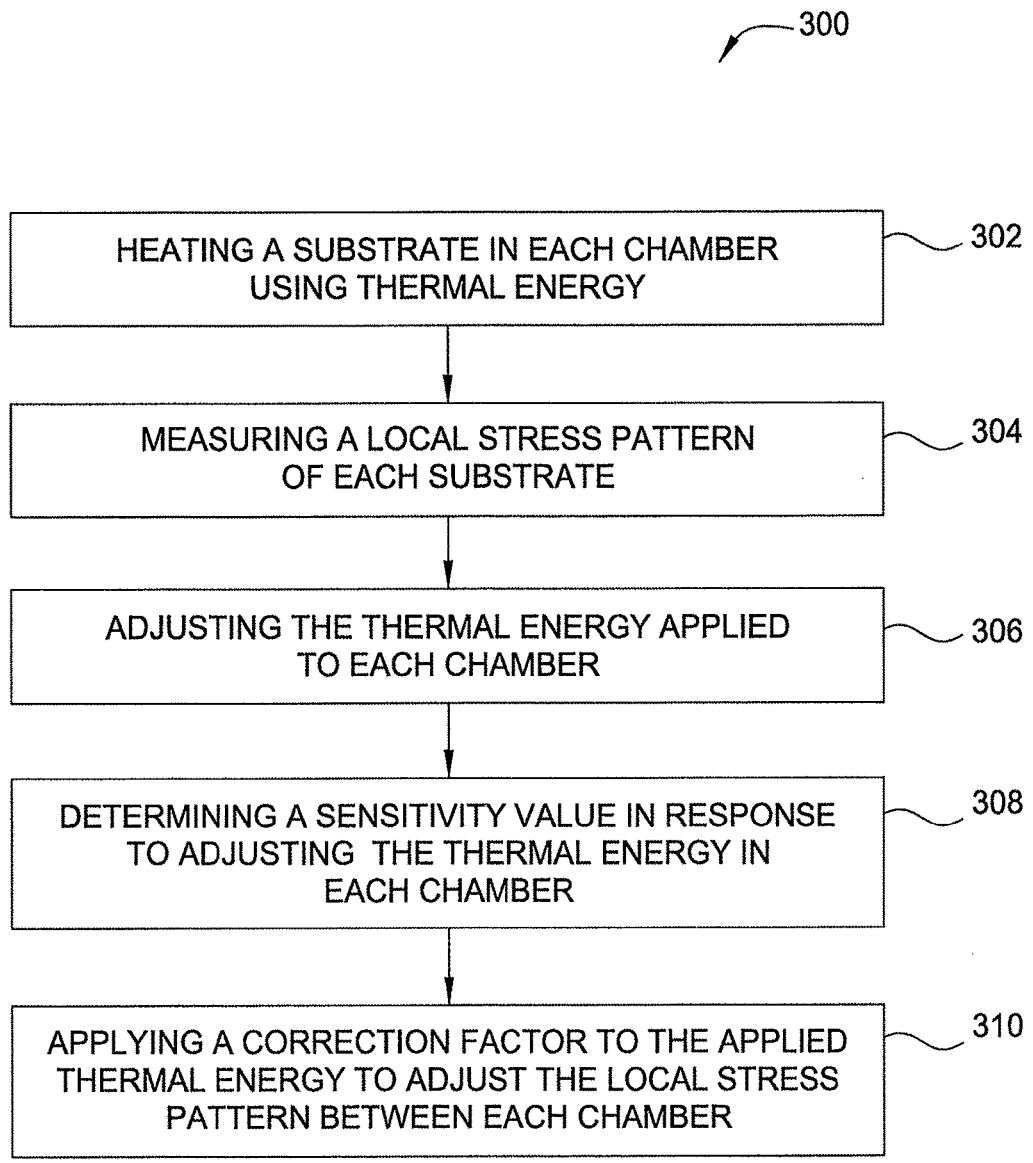
FIG. 3 shows a method for improved overlay between two or more chambers, according to one embodiment.

FIG. 3 shows a method for improved overlay between two or more chambers, according to one embodiment. The method 300 may be utilized by a chamber 100 depicted in FIG. 1 or system 200 depicted in FIG. 2. At operation 302 each substrate is heated in each chamber using thermal energy. The heat applied to each substrate may cause distortions in the substrate that may cause misalignment in subsequent lithographic exposure processes. The distortions seen in the substrate of one chamber may be different than the distortions seen in a second substrate of another chamber. As such it is desirable to determine where these distortions, such as radial shape changes due to temperature gradients, appear on the substrate. At operation 304 one or more points are plotted on a k map to determine a local stress pattern of each substrate. An absorptance (k) map utilizes in-plane displacements (IPD) measurements, such as substrate geometry, to correlate with lithography overlay performance. The IPD map is plotted utilizing a plurality of points, such as forty-nine points dispersed throughout the circular IPD map. The forty-nine points may be grouped into an inner zone and an outer zone. The outer zone constitutes a grouping of various points along the edge of the circular IPD map. The inner zone constitutes a grouping of various points near the center of the circular IPD map. Each of the forty-nine points advantageously conveys information about the topography of the substrate to determine where distortions arise. The information gathered initially from each of the forty-nine points is determined to be the baseline of each substrate.

At operation 306 the thermal energy is adjusted as applied to the one or more points on the k map of each chamber. Data from the forty-nine points is once again collected to determine the amount or change in the depth profile for each degree in temperature change for each substrate. The amount of change in the depth profile is the sensitivity of k, or the sensitivity of the extinction coefficient. Utilizing one or more zones, the sensitivity of each substrate to individual temperature changes is determined. For example, in a dual zone heater pedestal with an inner zone and an outer zone, the sensitivity of k for each region of the substrate can be determined using one or more points of the forty-nine points. At operation 308 the sensitivity value for each of the one or more points on the k map is determined in response to adjusting the thermal energy in each chamber. It may be contemplated that the sensitivity value may be calculated using density, thickness, or pressure of the substrate.

At operation 310 a correction factor is applied to the applied thermal energy to adjust the local stress pattern in each chamber. After knowing the sensitivity value, the stress pattern from one chamber can be matched to the stress pattern of another chamber by adjusting the thermal energy within each heater to have the same k map. As such, there will be a uniform change from one chamber to the next. By ensuring a uniform change or in-plane displacement of each substrate from one chamber to the next, a lithography mask may be shifted to match the local stress pattern in each chamber.

Figure 4:
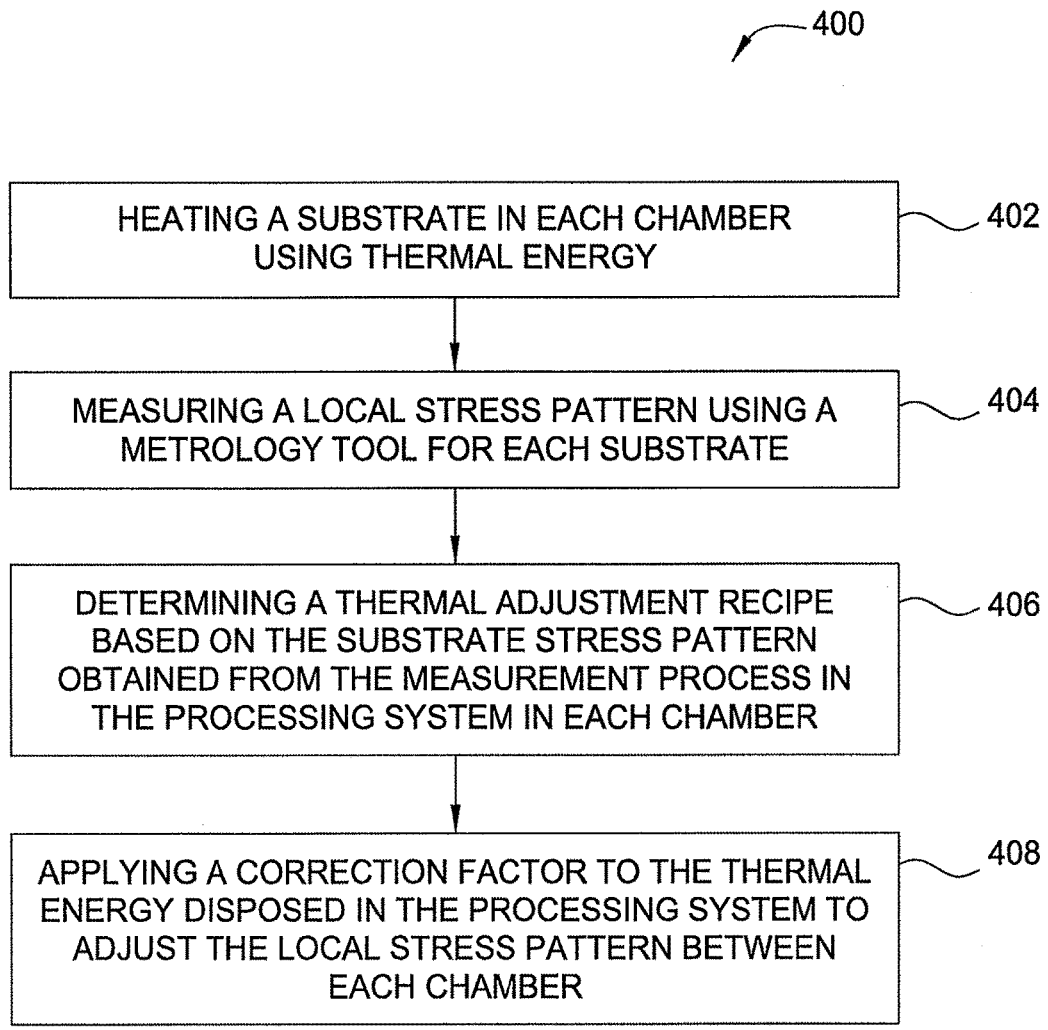
FIG. 4 shows a method for improved overlay between two or more chambers, according to another embodiment.

FIG. 4 shows a method for improved overlay between two or more chambers, according to another embodiment. The method begins at operation 402 by heating a substrate in each chamber using thermal energy. The heat applied to each substrate may cause distortions in the substrate that may cause misalignment in subsequent lithographic exposure processes. The distortions seen in the substrate of one chamber may be different than the distortions seen in a second substrate of another chamber. As such it is desirable to determine where these distortions, such as radial shape changes due to temperature gradients, appear on the substrate. At operation 404, a local stress pattern is measured using a metrology tool for each substrate in the one or more chambers. In one embodiment the metrology tool used to measure the local stress pattern includes plotting one or more points on a k map to determine a local stress pattern of each substrate. An absorptance (k) map utilizes in-plane displacements (IPD) measurements, such as substrate geometry, to correlate with lithography overlay performance. The IPD map is plotted utilizing forty-nine points dispersed throughout the circular IPD map. The forty-nine points may be grouped into an inner zone and an outer zone. The outer zone constitutes a grouping of various points along the edge of the circular IPD map. The inner zone constitutes a grouping of various points near the center of the circular IPD map. Each of the forty-nine points conveys information about the topography of the substrate to determine where distortions arise. The information gathered initially from each of the forty-nine points is determined to be the baseline of each substrate.

At operation 406, a thermal adjustment recipe is determined based on the substrate stress pattern obtained from the measurement process in the processing system in each chamber. The thermal energy is adjusted as applied to the one or more points on the k map of each chamber. Data from the forty-nine points is once again collected to determine the amount or change in the depth profile for each degree in temperature change for each substrate. In other words, the change in depth of the deposited material on the substrate is measured at forty-nine points. The amount of change in the depth profile is the sensitivity of k, or the sensitivity of the extinction coefficient. Utilizing one or more zones, the sensitivity of each substrate to individual temperature changes is determined. For example, in a dual zone heater pedestal with an inner zone and an outer zone, the sensitivity of k for each region of the substrate can be determined using one or more points of the forty-nine points. The sensitivity value for each of the one or more points on the k map is determined in response to adjusting the thermal energy in each chamber.

At operation 408 a correction factor is applied to the applied thermal energy to adjust the local stress pattern in each chamber. After knowing the sensitivity value, the stress pattern from one chamber can be matched to the stress pattern of another chamber by adjusting the thermal energy within each heater to have the same k map. As such, there will be a uniform change from one chamber to the next. By ensuring a uniform change or in-plane displacement of each substrate from one chamber to the next, a lithography mask may be shifted to match the local stress pattern in each chamber. In one embodiment, the method 400 may be executed by a non-transitory computer-readable medium.

By utilizing and specifically k-mapping one or more substrates in one or more chambers, a sensitivity value can be determined for each chamber. After knowing the sensitivity value, the stress pattern from one chamber can be matched to the stress pattern of another chamber by adjusting the thermal energy within each heater to have the same k map. As such, there will be a uniform change from one chamber to the next. By ensuring a uniform change or in-plane displacement of each substrate from one chamber to the next, a lithography mask may be shifted to match the local stress pattern in each chamber thus improving lithographic overlay.

While the foregoing is directed to embodiments of the present disclosure, other and further embodiments of the disclosure may be devised without departing from the basic scope thereof, and the scope thereof is determined by the claims that follow.

The invention claimed is:

1. A method for improved overlay between two or more chambers, comprising:
   depositing a material on a substrate;
   heating the substrate in each chamber of the two or more chambers using thermal energy;
   measuring a local stress pattern of the substrate in each chamber of the two or more chambers, wherein measuring the local stress pattern includes measuring an amount of change in a depth of the deposited material on the substrate;
   adjusting the thermal energy provided in each chamber;
   determining a sensitivity value in response to adjusting the thermal energy provided in each chamber; and
   applying a correction factor to the thermal energy provided in each chamber to adjust the local stress pattern between the two or more chambers.

2. The method of claim 1, wherein at least one of the two or more chambers is a PECVD chamber.

3. The method of claim 1, further comprising shifting a lithography mask to match the local stress pattern in each chamber.

4. The method of claim 1, wherein the measuring a local stress pattern is determined by plotting a plurality of points on a k map.

5. The method of claim 4, wherein the determining a sensitivity value in response to adjusting the thermal energy is determined for each of the plurality of points on the k map.

6. The method of claim 1, wherein the applying the correction factor to the applied thermal energy to adjust the local stress pattern between each chamber is performed by a controller.

7. The method of claim 6, wherein the adjusting the thermal energy applied to each chamber is performed by the controller.

8. A method for improved overlay in a processing system, comprising:
   heating a substrate in each chamber of the processing system using thermal energy;
   measuring a local stress pattern using a metrology tool for each substrate;
   determining a thermal adjustment recipe based on the local stress pattern of each substrate obtained from the measurement process in each chamber in the processing system; and
   applying a correction factor to the thermal energy provided in each chamber of the processing system to adjust the local stress pattern between each chamber.

9. The method of claim 8, wherein at least one chamber of the processing system is a PECVD chamber.

10. The method of claim 8, further comprising shifting a lithography mask to match the local stress pattern in each chamber.

11. The method of claim 8, wherein the measuring a local stress pattern is determined by plotting a plurality of points on a k map.

12. The method of claim 8, wherein the applying a correction factor to the thermal energy provided in each chamber of the processing system to adjust the local stress pattern between each chamber is performed by a controller.

13. The method of claim 8, wherein the determining a thermal adjustment recipe based on the local stress pattern of each substrate is determined in a computing system.

14. The method of claim 8, wherein the metrology tool is an in-plane displacement map.

15. A non-transitory computer-readable medium including instructions, that, when executed by a processing unit of a system, cause the system to monitor stress patterns in the system by performing the steps of:
   heating a substrate in each chamber of the system using thermal energy;
   measuring a local stress pattern using a metrology tool for each substrate in each chamber;
   determining a thermal adjustment recipe in a computing system based on the substrate stress pattern obtained from the measurement process in the processing system in each chamber; and
   applying a correction factor to the thermal energy disposed in the processing system to adjust the local stress pattern between each chamber.

16. The non-transitory computer-readable medium of claim 15, wherein at least one chamber of the system is a PECVD chamber.

17. The non-transitory computer-readable medium of claim 15, further comprising shifting a lithography mask to match the local stress pattern in each chamber of the system.

18. The non-transitory computer-readable medium of claim 15, wherein the measuring a local stress pattern is determined by plotting a plurality of points on a k map.

19. The non-transitory computer-readable medium of claim 15, wherein the applying a correction factor to the thermal energy disposed in the processing system to adjust the local stress pattern between each chamber is performed by a controller.

20. The non-transitory computer-readable medium of claim 15, wherein the determining a thermal adjustment recipe based on the substrate stress pattern is determined in the computing system.

* * * * *